(12) United States Patent
Blais

(10) Patent No.: US 6,788,051 B2
(45) Date of Patent: Sep. 7, 2004

(54) METHOD AND SYSTEM OF SPECTROSCOPIC MEASUREMENT OF MAGNETIC FIELDS

(75) Inventor: Kristin A. Blais, Fairfax, VA (US)

(73) Assignee: Raytheon Company, Waltham, MA (US)

(*) Notice: Subject to any disclaimer, the term of this patent is extended or adjusted under 35 U.S.C. 154(b) by 139 days.

(21) Appl. No.: 10/208,974

(22) Filed: Jul. 30, 2002

(65) Prior Publication Data

US 2003/0053051 A1 Mar. 20, 2003

Related U.S. Application Data

(60) Provisional application No. 60/309,339, filed on Jul. 31, 2001.

(51) Int. Cl.$^7$ .............................. G01R 33/02; G01J 3/28
(52) U.S. Cl. .................... 324/244.1; 356/326; 356/327; 356/328; 324/244
(58) Field of Search .......................... 356/364, 366–367, 356/300, 326–328; 250/340; 324/244, 244.1

(56) References Cited

U.S. PATENT DOCUMENTS 5,125,743 A * 6/1992 Rust et al. .................. 356/367

OTHER PUBLICATIONS

"Zeeman Effect in the Atomospheric Oxygen Bands; Production of a Strong Magnetic Field Over a Length of 80 cm," R. Schmid, Physical Review, vol. 49, Issue 3, pp. 271–271, Feb. 1936.

"On the Zeeman Photometer Observing Upper Atmospheric Winds In The Daytime," J. Nakamura, (International Association of Geomagnetism and Aeronomy, Symposium on Dynamics, Chemistry and Thermal Processes in the Ionosphere and Thermosphere, Kyoto, Japan, Sep. 18–20, 1973.) Journal of Atmospheric and Terrestrial Physics, vol. 36, pp. 1877–1881, Nov. 1974.

"Diurnal Variation of the Sodium Dayglow," M.L. Chanin et al., Journal of Geophysical Research, vol. 80, pp. 2854–2858, Jul. 1975.

"Emission and Absorption of the Earth's Atmosphere near the 2.53 mm Oxygen Absorption Line," L.E. Kopilovich et al., (Akademila nauk SSSR, Izvestila, Fizika Atmosfery i Okeana, vol. 11, Oct. 1975, p. 999–1007.) Academy of Sciences, USSR, Isvestiya, Atmospheric and Oceanic Physics, vol. 11, pp. 627–631, May 1976.

Abstract entitled "Possibilities of Using Radiation in the Oxygen Absorption Line at Lambda = 2.53 mm on Slant Paths for Thermal Sounding of the Atmosphere," Y.M. Timofeyev et al., Possibilities of Using Radiation in the Oxygen Absorption Line at Lambda—2.53 mm on Slant Paths for Thermal Sounding of the Atmosphere Transl. into English from Gosuparst Univ., Probl. Atmos. Phys., Coll. 15 (Leningrad), pp. 65–76, Jun. 1979.

"Dayglow Investigations at Pune," A.D. Tillu et al., In: Low latitude aeronomical processes: Proceedings of the Symposium, Bangalore, India, May 29–Jun. 9, 1979. (A80–52226 23–46) Oxford and Elmsford, N.Y., Pergamon Press, pp. 73–77, Jan. 1980.

(List continued on next page.)

Primary Examiner—Bot LeDynh
(74) Attorney, Agent, or Firm—Baker Botts L.L.P.

(57) ABSTRACT

There is disclosed a method and apparatus for spectroscopically sensing a man-made, terrestrial or atmospheric magnetic field emanating from an object that includes receiving a radiance emission from an object and dispersing the radiance emission into parts of the electromagnetic spectrum. The method also includes detecting a part of the electromagnetic spectrum identified with a selected gas and measuring the magnetic field from a part of the electromagnetic spectrum based on spectral spreading of a spectral line.

28 Claims, 2 Drawing Sheets

OTHER PUBLICATIONS

"Temperature Profiles of the Atmospheres by Microwave Radiometry," G.K. Hartmann et al., (Deutsche Meteorologische Gesellschaft, Symposium ueber Strahlungstransportprobleme und Satellitenmessungen in der Meteorologie und Oceanographie, Cologne, West Germany, Mar. 22–26, 1982.) Annalen der Meteorologie, No. 18, pp. 94–96, Jan. 1982.

PhD. Theses entitled "Topics in the Application of the Zeeman Effect," Edgar A. Arriaga, Dalhousie University (Canada), Source: Dissertation Abstracts International, vol.: 53–01, Section: B, p.: 0340, 1990.

"Magnetic Fields in the Atmospheres of the Sun and of the Earth," R. Berton,I La Recherche Aerospatiale (English Edition) (ISSN 0379–380X), No. 5, pp. 21–30, 1991.

"On the Sensitivity of Stokes profiles to Physical Quantities," B. Ruiz Cobo, et al., Astronomy and Astrophysics (ISSN 0004–6361), vol. 283, No. 1, pp. 129–143, Mar. 1994.

* cited by examiner-

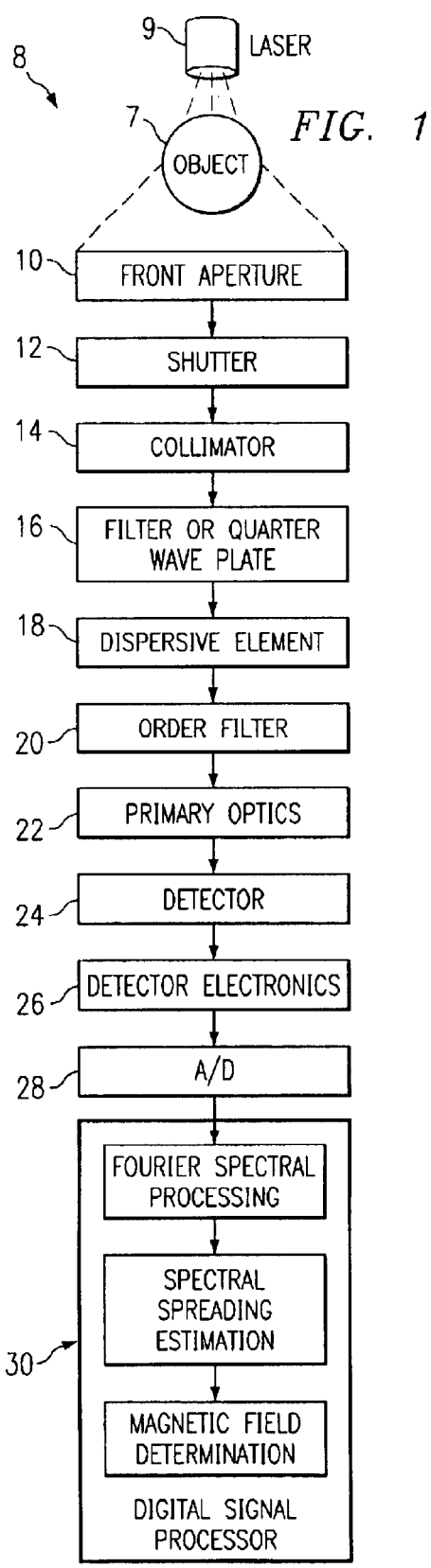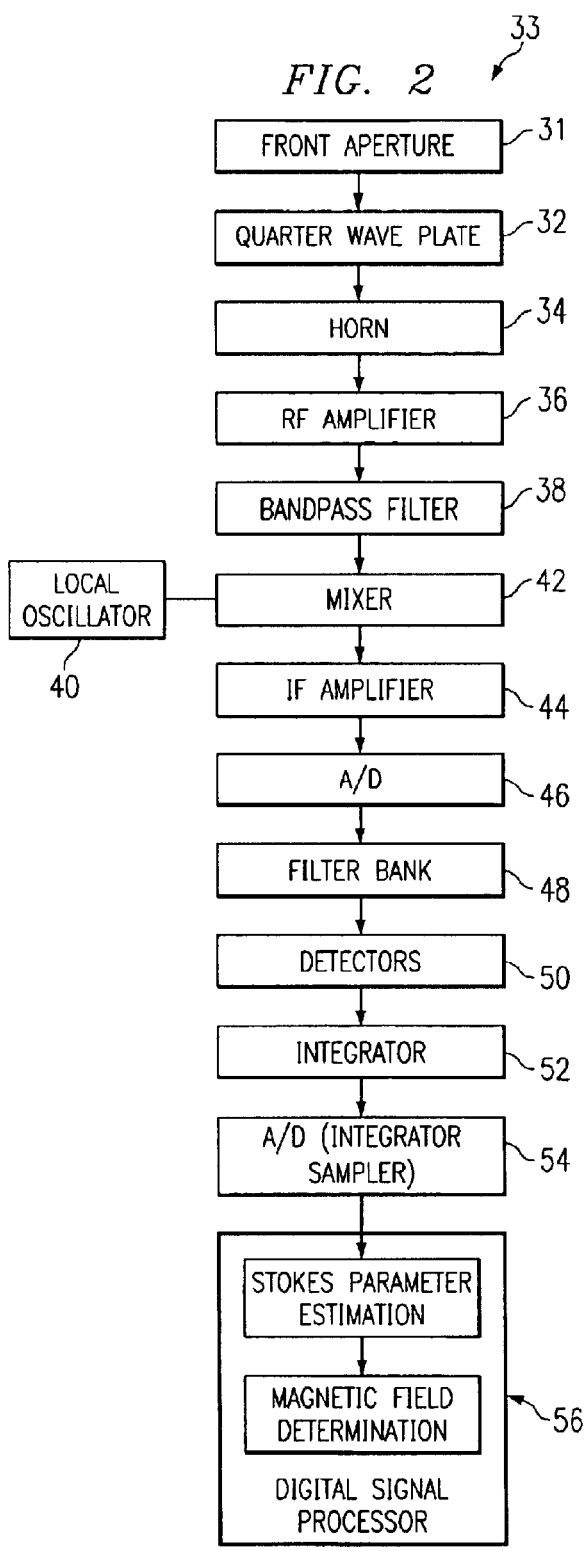

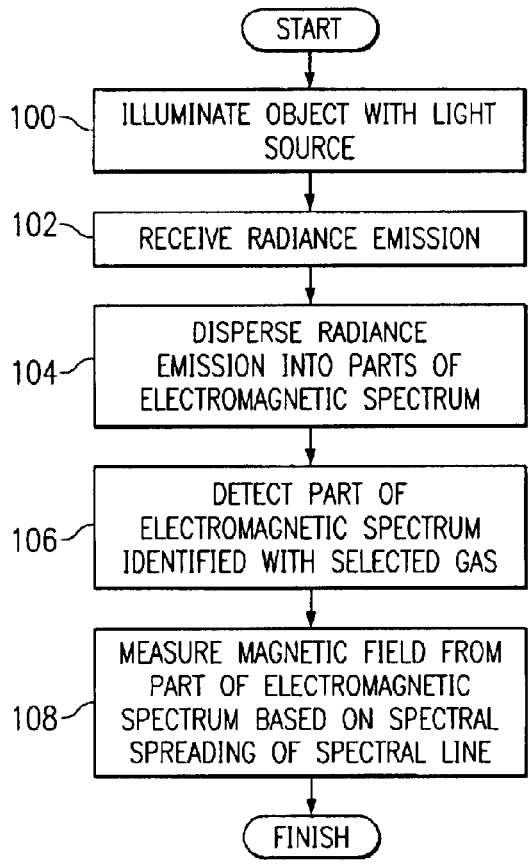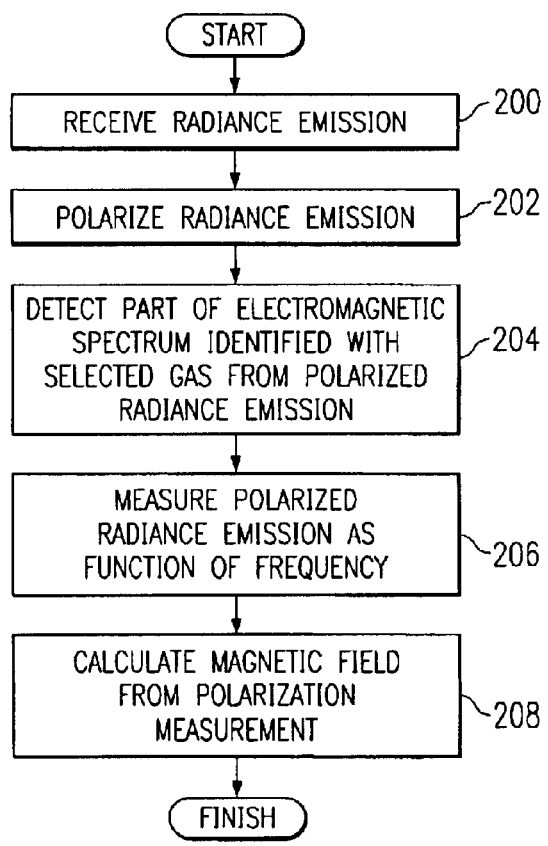

METHOD AND SYSTEM OF SPECTROSCOPIC MEASUREMENT OF MAGNETIC FIELDS

RELATED APPLICATION

This application claims the benefit of U.S. provisional application Serial No. 60/309,339, filed Jul. 31, 2001, entitled Spectroscopic Remote Sensing of Magnetic Fields.

TECHNICAL FIELD OF THE INVENTION

This invention relates to spectroscopic measurement of magnetic fields, and more particularly to spectroscopic remote sensing of magnetic fields utilizing a gas.

BACKGROUND OF THE INVENTION

Physicists have long known that magnetic fields that permeate any material alter the electromagnetic spectrum emanating from that material. The magnetic field permeating a material alters the wavelength, polarization, and scattering of the electromagnetic spectrum including altering the index of refraction of the material, all of which can be observed spectroscopically. These phenomena are known as the Zeeman, Hanle, and Faraday effects. Since the magnitude of these effects are directly proportional to the strength of the magnetic field, any of the three effects can be used to derive the magnetic field strength. Astronomers have exploited these phenomena to study astronomical magnetic fields.

Observation of the Zeeman, Hanle, or Faraday effects typically requires a radiance or emission source, a gas, and a magnetic field. Astronomical objects contain all three; a star is made up of glowing gas and magnetic fields. Present methods of detecting man-made or terrestrial magnetic fields use electromotive force (EMF) sensors that react to the magnetic field. Accurately measuring the magnetic fields using present method sensors requires that the sensor either be very close to the area of interest or that the sensor be very large.

SUMMARY OF THE INVENTION

The present invention provides a method and system for spectroscopic measurement of magnetic fields that substantially eliminates or reduces at least some of the disadvantages and problems associated with previous methods and systems for measuring magnetic fields.

In accordance with a particular embodiment of the present invention, a method for spectroscopically sensing a magnetic field emanating from an object includes receiving a radiance emission from an object and dispersing the radiance emission into parts of the electromagnetic spectrum. The method also includes detecting a part of the electromagnetic spectrum identified with a selected gas and measuring the magnetic field from a part of the electromagnetic spectrum based on spectral spreading of a spectral line.

The selected gas may comprise a noble gas, such as argon, and dispersing the radiance emission may comprise passing the radiance emission through a prism, diffraction grating or grism.

In accordance with another embodiment of the present invention, a method for spectroscopically sensing a magnetic field emanating from an object includes receiving a radiance emission from an object and polarizing the received radiance emission. The method also includes detecting a part of the electromagnetic spectrum identified with a selected gas from the polarized radiance emission, measuring the polarized radiance emission as a function of frequency and calculating the magnetic field from the polarization measurements. Measuring the polarized radiance emission as a function of frequency may comprise measuring the polarized radiance emission in four Stokes parameters.

Technical advantages of particular embodiments of the present invention include exploitation of the Zeeman, Hanle or Faraday effects to measure terrestrial or manmade magnetic fields. Another advantage includes the use of either direct or reflected solar light as a source for terrestrial or man-made magnetic field measurements. Naturally occurring terrestrial atmospheric gases, molecules or chemicals, such as argon, are exploited for the terrestrial or man-made magnetic field measurements.

Particular embodiments of the invention utilize an argon laser or other laser to illuminate an object for magnetic field measurements. Commercial grade argon gas lasers may be used to illuminate the object to make the magnetic field measurements. A further advantage of the invention is found in the minimal size of the sensor that enables a user to measure a magnetic field with a handheld or airborne sensor.

Other technical advantages will be readily apparent to one skilled in the art from the following figures, descriptions and claims. Moreover, while specific advantages have been enumerated above, various embodiments may include all, some or none of the enumerated advantages.

BRIEF DESCRIPTION OF THE DRAWINGS

For a more complete understanding of particular embodiments of the invention and their advantages, reference is now made to the following descriptions, taken in conjunction with the accompanying drawings, in which:

FIG. 1 is a block diagram of a system for utilizing spectroscopy to measure a magnetic field emanating from an object;

FIG. 2 is a block diagram of a system for utilizing spectropolarimetry to measure a magnetic field emanating from an object;

FIG. 3 is a flowchart illustrating a method for spectroscopically sensing a magnetic field emanating from an object in accordance with an embodiment of the present invention; and FIG. 4 is a flowchart illustrating a method for spectroscopically sensing a magnetic field emanating from an object in accordance with another embodiment of the present invention.

DETAILED DESCRIPTION OF THE INVENTION

FIG. 1 illustrates a block diagram of a spectroscopic measurement system 8 for measuring magnetic fields emanating from a man-made or terrestrial object using spectroscopy. System 8 utilizes spectroscopy to measure magnetic fields emanating from man-made or terrestrial objects. System 8 exploits the Zeeman effect for observation of the shifting of the spectrum wavelengths in a line spectrum as a result of the magnetic field. The system utilizes an appropriate region of the electromagnetic spectrum, for example, the visible, infrared, or radio frequency region of the electromagnetic spectrum, for resolution of the magnetic field. System 8 utilizes an appropriate terrestrial absorption or electromagnetic spectrum emission line that is magnetically sensitive (that varies with magnetic field), and whose density gradient with geography and altitude are known. Sunlight or an artificial light source (for example, a laser, maser or broadband) may be used as a source of illumination with system 8. The system may be useful throughout the electromagnetic spectrum.

Radiance emission from an object 7 is received at a front aperture 10. Object 7 may be a man-made or terrestrial object. The radiance emission may be produced by sunlight or an artificial light source, such as a laser 9. The received emission is sampled by operation of a shutter 12 and applied to a collimator 14. The collimated emission from the collimator 14 as received and sampled by the shutter 12 is applied to a filter or quarter wave plate 16. The selection of using a quarter wave plate or a filter will determine whether the implementation of system 8 includes polarization. For example, for a non-polarized implementation a filter will be utilized instead of a quarter wave plate; however, for a polarized implementation a quarter wave plate is utilized.

The output of the filter or quarter wave plate 16 is applied to a dispersive element 18 such as a prism, diffraction grating or grism. The output of the dispersive element 18 is a spectrum in the form of intensity versus wavelength and is supplied through an order filter 20 to primary optics 22. Primary optics 22 focus the processed, received emissions onto a detector 24. In particular embodiments, detector 24 may comprise a complementary metal oxide semiconductor (CMOS) detector or a charged coupled device (CCD) detector. The detector 24 responds to wavelengths related to naturally occurring terrestrial atmospheric gas molecules and chemicals to output a signal as a measurement of a terrestrial or manmade magnetic field. In particular embodiments, the atmospheric gas molecules may comprise a noble gas, such as argon.

Using a noble gas for analysis may be advantageous because the spectral lines of a noble gas are not known to interact with other gases, molecules, chemicals or compounds in the atmosphere. Moreover, the variation of noble gases with altitude is well behaved and documented. Detecting the wavelengths related to noble gas argon in system 8 may be advantageous because of the abundance of argon in the atmosphere of the earth and because there are thousands of argon spectral lines throughout the electromagnetic spectrum. If nighttime measurements are to be taken with system 8 or if there is insufficient solar spectra irradiance, then an argon laser, such as laser 9 of FIG. 1, or other artificial light source can be used to stimulate the atmospheric argon.

Delivering colorless, odorless and essentially harmless argon into an area of interest will compensate for the low number densities of argon spectral lines over short path lengths. If detection of the radiated emission signal is not of sufficient intensity for accurate measurement due to either long distances from the object or poor sensitivity conditions, the spectral signal of interest can be boosted by introducing more argon or other selected gases locally to the object. This higher density of gas will result in a proportionally higher emission of photons from the gas and will result in a corresponding increase in the signal strength which improves detection and measurement of the spectral region of interest.

The output signal from the detector 24 is processed through detector electronics 26 and applied to an analog to digital converter (A/D) 28. The digital output of the analog to digital converter 28 is applied to a digital signal processor (DSP) 30. In this embodiment, DSP 30 includes a mechanism for Fourier spectral processing, spectral spreading estimation and magnetic field determination. In other embodiments such functions may be performed by a plurality of components of the DSP. The DSP's programming code converts the A/D's time domain date to the frequency domain by doing a Fourier transform routine. The spectral frequency data is then analyzed by additional software code to determine the degree of spectral spreading for the spectral line of interest. This spreading measurement caused by the Zeeman effect is then used by further code to determine the required magnetic field intensity needed to induce this result which is the local magnetic field strength surrounding the object 7.

For the infrared segment of the electromagnetic spectrum, measurements may be made by radio frequency (RF) antenna elements, such as a RF dish or horn, subreflector, feed, transmission line, and receiver along with associated electronics, such as a processor and mechanical structures. To measure the RF spectrum, antenna elements may be scanned in frequency or a filter bank or superheterodyne receiver may be used. The small size of the RF dish or horn, as compared to typical large electromagnetic frequency sensors, enables a sensor of the present invention to be mounted to a ground vehicle, such as a Humvee™, an air vehicle, such as an unmanned aerial vehicle (UAV) or an orbiting satellite.

Spectroscopic measurement system 8 utilizes spectroscopy to measure the magnetic field emanating from an object 7, such as a power line. System 8 may be particularly suited towards measuring stronger magnetic fields. Remotely making spectroscopic measurements enables sensors of similar size to be used for measurements at varying distance, including extended distance measurements.

FIG. 2 illustrates a block diagram of a spectropolarimetry system 33 for measurement of magnetic fields utilizing spectropolarimetry. System 33 measures magnetic fields emanating from man-made or terrestrial objects and is particularly useful for measuring weaker magnetic fields. The system 33 measures the magnetic field by using polarization observed in the Zeeman, Hanle, or Faraday effects. This includes observing spin-flip transitions of the electrons in atoms. Like system 8 of FIG. 1, a noble gas element such as argon may be used in system 33. Other elements and molecules abundant in the radio frequency region of the electromagnetic spectrum may also be used.

Polarization as a function of frequency is measured in all four Stokes parameters, I, Q, U, and V. These parameters characterize the "x" and "y" component of an electric light vector and the phase between the x and y components. By way of further explanation, I is a measurement of the radiation intensity, Q is a measurement of the x vector, U is a measurement of the y vector, and V is the degree of circular polarization. The magnetic field is calculated from these measurements by comparison of the peaks of the right hand and left hand circular polarization when possible (I+V, I−V) and the ratio of I/V when right hand and left hand circular polarization measurement is not possible.

In system 33, a radiance emission received at a front aperture 31 from an object (not shown) passes to a quarter wave plate 32 coupled to a horn 34 or other antenna, such as an RF antenna. The object may be illuminated by a light source as illustrated with respect to system 8 in FIG. 1. Quarter wave plate 32 may act as a polarization mechanism. The emission received at the horn 34 is converted by the horn 34 to analog signals applied to the input of the RF amplifier 36. RF amplifier 36 has an output coupled to a bandpass filter 38. The output of the bandpass filter 38 is mixed with a local oscillator signal from an oscillator 40 in a mixer 42. The mixing of the output of the bandpass filter 38 with a local oscillator signal in the mixer 42 generates an intermediate frequency (IF) signal applied to an IF amplifier 44. The output of the IF amplifier 44 is converted into a digital signal in an analog to digital converter 46 and applied to a filter bank 48. The output of the filter bank 48 is a desired segment of RF spectrum that is applied to a plurality of detectors 50. Each detector 50 is responsive to a selected part of the RF spectrum related to naturally occurring terrestrial atmospheric gas, molecules, or chemicals associated with the noble gases, such as argon. The responses from the plurality of detectors 50 are integrated in an integrator 52 and sampled by an analog to digital converter (A/D) 54, or an integrator sampler. Data from the A/D 54 is then processed by software code on a digital signal processor 56. DSP 56 may include one or more components for Stokes parameter estimation and magnetic field determination. DSP 56 determines the Stokes parameters and the corresponding magnetic field. This field strength estimate is the local magnetic field present around the object. A polarization plot with wavelength (spectral polarization) or an index of refraction chart is also produced by system 33.

Both system 8 of FIG. 1 and system 33 of FIG. 2 generate output signals that vary with terrestrial or man-made magnetic fields, enabling the magnetic fields to be observed spectroscopically. The disclosed systems also find utility in the study of magnetic fields in or above fluids and solids by utilizing reflected sunlight and a high spectral resolution sensor.

FIG. 3 is a flowchart illustrating a method for spectroscopically sensing a magnetic field emanating from an object in accordance with an embodiment of the present invention. The method begins at step 100 where an object is illuminated with a light source, such as a laser. At step 102, a radiance emission is received from the object. In particular embodiments, the radiance emission may comprise the use of sunlight or artificial light and may be received at a front aperture. At step 104, the radiance emission is dispersed into parts of the electromagnetic spectrum. Such dispersion may be accomplished through a prism, diffraction grating or grism.

At step 106, a part of the electromagnetic spectrum identified with a selected gas is detected. Such detection may be accomplished through a CMOS or CCD detector. The selected gas may comprise a noble gas, such as argon. At step 108, the magnetic field is measured from a part of the electromagnetic spectrum based on spectral spreading of a spectral line. The method illustrated in FIG. 3 may be particularly suited towards measuring stronger magnetic fields.

FIG. 4 is a flowchart illustrating a method for spectroscopically sensing a magnetic field emanating from an object in accordance with another embodiment of the present invention. The method begins at step 200 where a radiance emission from an object is received. The radiance emission may comprise the use of sunlight or artificial light and may be received at a front aperture. At step 202, the radiance emission is polarized by a polarization mechanism. In particular embodiments, such polarization mechanism may include a quarter wave plate.

At step 204, a part of the electromagnetic spectrum identified with a selected gas is detected from the polarized radiance emission. Such detection may be accomplished through a CMOS or CCD detector. The selected gas may comprise a noble gas, such as argon. The polarized radiance emission is measured as a function of frequency at step 206, and the magnetic field from is calculated from the polarization measurements at step 208. Particular embodiments may also include a step of illuminating the object with a light source, such as a laser. The method illustrated in FIG. 4 utilizes spectropolarimetry in measuring and calculating a magnetic field and may be particularly suited towards measuring weaker magnetic fields.

Although the present invention has been described in detail, various changes and modifications may be suggested to one skilled in the art. It is intended that the present invention encompass such changes and modifications as falling within the scope of the appended claims.

What is claimed is:

1. A method for spectroscopically sensing a man-made, terrestrial or atmospheric magnetic field emanating from an object, comprising:

selecting a gas that will allow detection of radiance emission associated with a magnetic field emanating from an object;

receiving the radiance emission from the object;

dispersing the radiance emission into parts of the electromagnetic spectrum;

detecting a part of the electromagnetic spectrum identified with the selected gas; and measuring the magnetic field from a part of the electromagnetic spectrum based on spectral spreading of a spectral line.

2. The method of claim 1, further comprising illuminating the object with a light source.

3. The method of claim 1, wherein dispersing the radiance emission comprises passing the radiance emission through a prism.

4. The method of claim 1, wherein dispersing the radiance emission comprises passing the radiance emission through a diffraction grating.

5. The method of claim 1, wherein dispersing the radiance emission comprises passing the radiance emission through a grism.

6. The method of claim 1, wherein the selected gas comprises a noble gas.

7. The method of claim 1, wherein the selected gas comprises argon.

8. A system for spectroscopically sensing a man-made, terrestrial or atmospheric magnetic field emanating from an object, comprising:

a front aperture configured to receive a radiance emission from an object;

a dispersive element coupled to the front aperture, the dispersive element configured to disperse the radiance emission into parts of the electromagnetic spectrum;

a detector coupled to the dispersive element, the detector configured to detect a part of the electromagnetic spectrum identified with a selected gas; and a digital signal processor coupled to the detector, the digital signal processor configured to measure the magnetic field from a part of the electromagnetic spectrum based on spectral spreading of a spectral line.

9. The system of claim 8, further comprising a light source to illuminate the object.

10. The system of claim 8, wherein the dispersive element comprises a prism.

11. The system of claim 8, wherein the dispersive element comprises a diffraction grating.

12. The system of claim 8, wherein the dispersive element comprises a grism.

13. The system of claim 8, wherein the selected gas comprises a noble gas.

14. The system of claim 8, wherein the selected gas comprises argon.

15. A method for spectroscopically sensing a man-made, terrestrial or atmospheric magnetic field emanating from an object, comprising:

selecting a gas that will allow detection of radiance emission associated with a magnetic field emanating from an object;

receiving a radiance emission from an object;

polarizing the received radiance emission;

detecting a part of the electromagnetic spectrum identified with a selected gas from the polarized radiance emission;

measuring the polarized radiance emission as a function of frequency; and calculating the magnetic field from the polarization measurements.

16. The method of claim 15, further comprising illuminating the object with a light source.

17. The method of claim 15, wherein the selected gas comprises a noble gas.

18. The method of claim 15, wherein the selected gas comprises argon.

19. The method of claim 15, wherein measuring the polarized radiance emission as a function of frequency comprises measuring the polarized radiance emission in four Stokes parameters.

20. A system for spectroscopically sensing a man-made, terrestrial or atmospheric magnetic field emanating from an object, comprising:

a front aperture configured to receive a radiance emission from an object;

a polarization mechanism coupled to the front aperture, the polarization mechanism configured to polarize the received radiance emission;

a detector coupled to the polarization mechanism, the detector configured to detect a part of the electromagnetic spectrum identified with a selected gas from the polarized radiance emission; and a digital signal processor coupled to the detector, the processor configured to measure the polarized radiance emission as a function of frequency and calculate the magnetic field from the polarization measurements.

21. The system of claim 20, further comprising a light source to illuminate the object.

22. The system of claim 20, wherein the selected gas comprises a noble gas.

23. The system of claim 20, wherein the selected gas comprises argon.

24. The system of claim 20, wherein the processor configured to measure the polarized radiance emission as a function of frequency comprises the processor configured to measure the polarized radiance emission in four Stokes parameters.

25. The method of claim 1, wherein the selected gas comprises a naturally occurring terrestrial atmospheric gas or injected gas.

26. The system of claim 9, wherein the selected gas comprises a naturally occurring terrestrial atmospheric gas or injected gas.

27. The method of claim 17, wherein the selected gas comprises a naturally occurring terrestrial atmospheric gas or injected gas.

28. The method of claim 23, wherein the selected gas comprises a naturally occurring terrestrial atmospheric gas or injected gas.

* * * * *